(12) United States Patent
Anzures et al.

(10) Patent No.: US 7,583,880 B2
(45) Date of Patent: Sep. 1, 2009

(54) METHODS OF FORMING PRINTED CIRCUIT BOARDS HAVING OPTICAL FUNCTIONALITY

(75) Inventors: Edgardo Anzures, Westborough, MA (US); Philip D. Knudsen, Northboro, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 12/005,990

(22) Filed: Dec. 28, 2007

(65) Prior Publication Data
US 2008/0187267 A1 Aug. 7, 2008

Related U.S. Application Data

(60) Provisional application No. 60/883,047, filed on Dec. 31, 2006.

(51) Int. Cl.
*G02B 6/00* (2006.01)
*B05D 5/06* (2006.01)

(52) U.S. Cl. .................. 385/129; 385/130; 385/147; 427/163.2

(58) Field of Classification Search .............. None
See application file for complete search history.

(56) References Cited

U.S. PATENT DOCUMENTS

| | | | |
|---|---|---|---|
| 6,057,079 A | 5/2000 | Shelnut | |
| 6,731,857 B2 | 5/2004 | Shelnut et al. | |
| 7,251,404 B2 | 7/2007 | Shelnut et al. | |
| 2003/0047355 A1* | 3/2003 | Lee et al. | 174/262 |
| 2004/0105652 A1 | 6/2004 | Shelnut et al. | |
| 2005/0163431 A1 | 7/2005 | Moynihan et al. | |
| 2005/0224946 A1* | 10/2005 | Dutta | 257/686 |
| 2006/0133756 A1* | 6/2006 | Shelnut et al. | 385/129 |
| 2006/0133766 A1* | 6/2006 | Shelnut et al. | 385/147 |
| 2006/0274995 A1* | 12/2006 | Lee et al. | 385/37 |

FOREIGN PATENT DOCUMENTS

WO  WO 03/005616 A2  1/2003

OTHER PUBLICATIONS

European Search Report of corresponding European Patent Application No. 07 15 0432 mailed Jun. 17, 2008.

* cited by examiner

*Primary Examiner*—Tina M Wong
(74) *Attorney, Agent, or Firm*—Jonathan D. Baskin

(57) ABSTRACT

Provided are methods of forming printed circuit boards having optical functionality. The methods involve applying a dry-film to a printed circuit board substrate and forming an optical waveguide over the dry-film. The invention finds particular applicability in the electronics and optoelectronics industries.

12 Claims, 3 Drawing Sheets

METHODS OF FORMING PRINTED CIRCUIT BOARDS HAVING OPTICAL FUNCTIONALITY

Figure 1A:
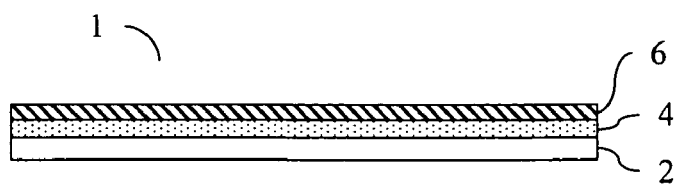

This application claims the benefit of priority under 35 U.S.C. §119(e) of Provisional Application No. 60/883,047, filed Dec. 31, 2006, the entire contents of which are herein incorporated by reference.

The present invention relates generally to the field of optoelectronics. In particular, the present invention relates to methods of forming printed circuit boards having optical functionality.

Signal transmission using pulse sequences of light is becoming increasingly important in high-speed communications and data transfer. For example, optical integrated circuits are gaining importance for high bandwidth optical interconnects. As a result, the integration of optical components such as waveguides, filters, optical interconnects, lenses, diffraction gratings, and the like, is becoming increasingly important.

The incorporation of optical layers in the form of embedded optical waveguides into printed circuit boards (PCBs) is known. For example, U.S. Pat. No. 6,731,857 and U.S. Published Application No. US20040105652 to Shelnut et al, disclose embedded optical waveguides formed with silsesquioxane chemistry on a printed circuit board substrate. The optical waveguides include a core and a clad surrounding the core, with optical radiation propagating in the core due to its higher index of refraction as compared to the clad. The optical waveguides may be formed by coating a bottom clad layer over the substrate, coating a photoimageable core layer over the bottom clad layer, photolithographically patterning the core layer to form a core structure and forming a top clad layer over the bottom clad layer and core structure.

Substrates used in the formation of printed circuit boards are typically constructed from a resin reinforced by a fabric cloth. Conventionally used materials include, for example, epoxies, polyimides and cyanate esters, with fiberglass being a typical fabric. Of these, fiberglass-reinforced epoxies such as FR-4 printed circuit board substrate are commonly used. When an optical waveguide such as described above is formed directly on such a printed circuit board substrate, optical performance can suffer. It is believed that optical loss in the waveguide results at least in part from surface topography variations in the printed circuit board substrate.

There is thus a need in the art for methods of forming printed circuit boards with optical functionality which address such problem associated with the state of the art. The invention provides methods of forming printed circuit boards having optical functionality. The methods involve applying a dry-film layer to a printed circuit board substrate, and forming an optical waveguide directly on the dry-film layer. The optical waveguide includes a core and a clad surrounding the core. In accordance with further aspects of the invention, the dry-film layer may be applied to the printed circuit board substrate by a lamination process, such as vacuum lamination, hot-roll lamination or cut-sheet lamination. The dry-film layer may be of a material of a type which is useful as a solder-mask or dielectric dry-film layer. The optical waveguide core and/or clad may include units of the formula $(RSiO_{1.5})$, wherein R is a substituted or unsubstituted organic group. The surface of the dry-film layer may be treated before formation of the clad to improve adhesion to the waveguide. Such treating may include, for example, one or more of mechanical polishing or treatment with corona discharge, flame, ozone or plasma. The invention further provides printed circuit boards formed by the inventive methods. The methods and devices of the invention can provide for optical waveguides having improved optical loss characteristics.

Other objects and advantages of the present invention will become apparent to one skilled in the art upon review of the following description, claims, and drawings appended hereto.

Figure 1B:
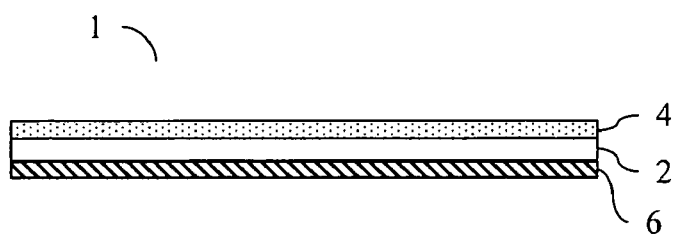
Figure 1C:
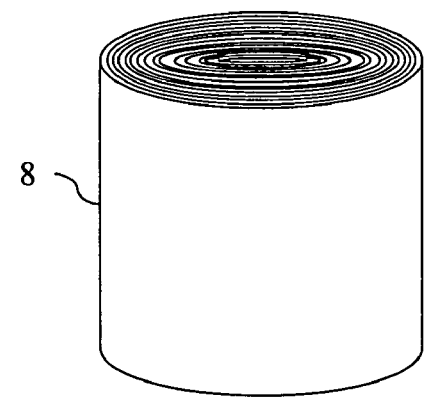
Figure 2A:
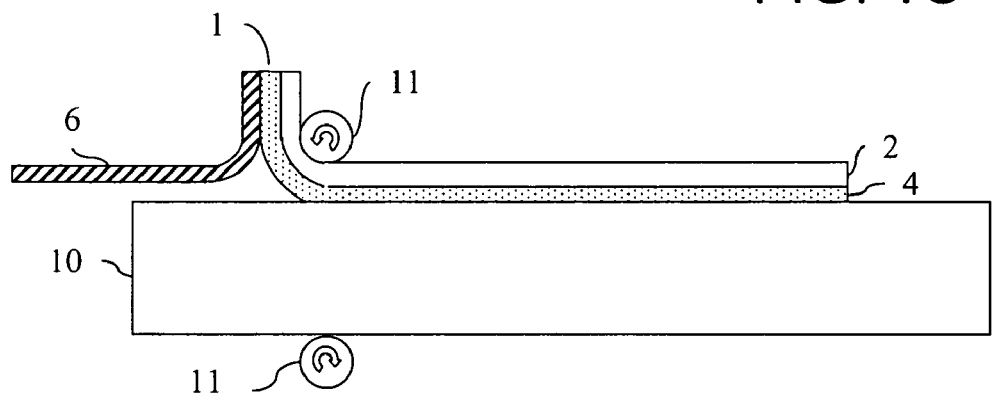
Figure 2B:
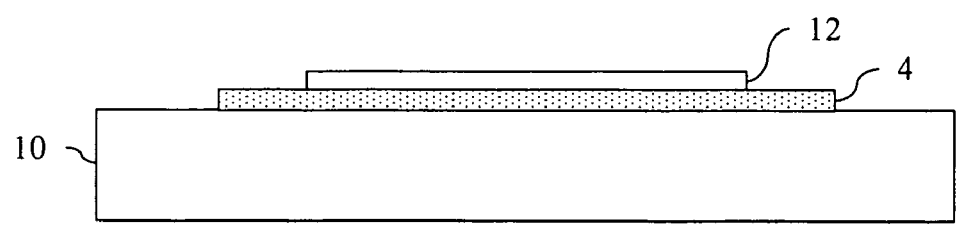
Figure 2C:
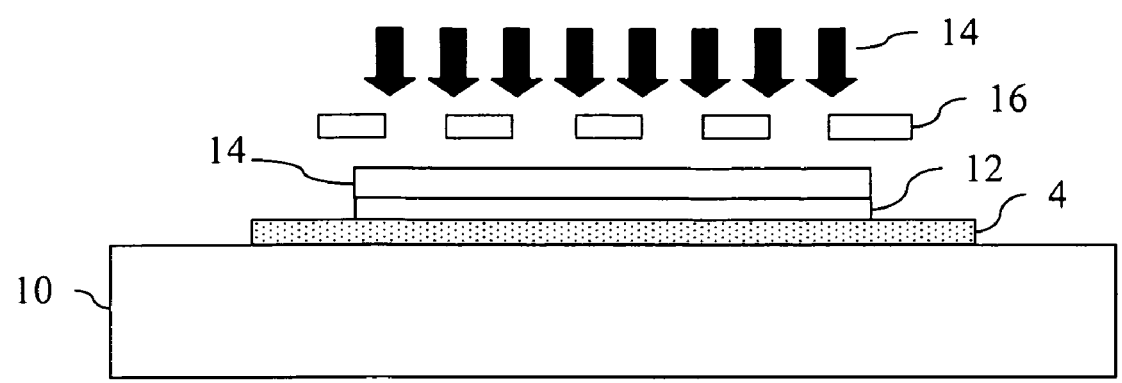
Figure 2D:
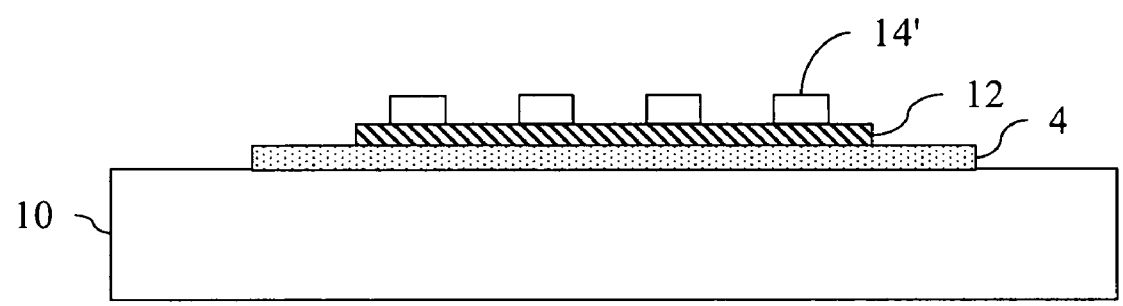
Figure 2E:
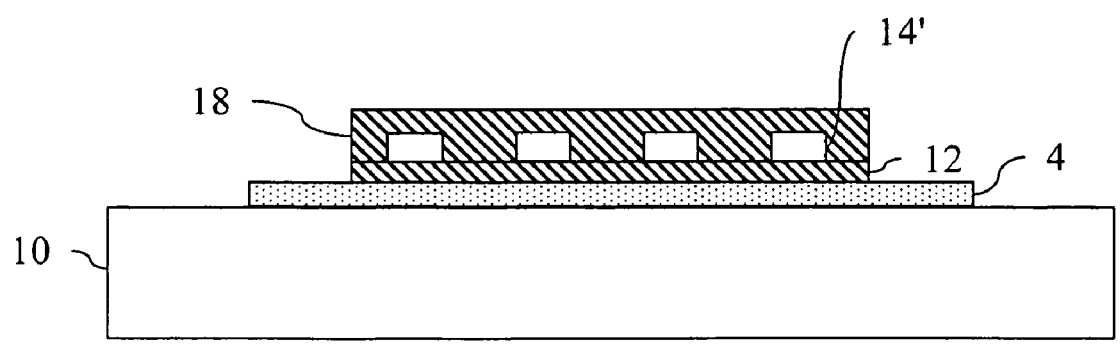
Figure 3:
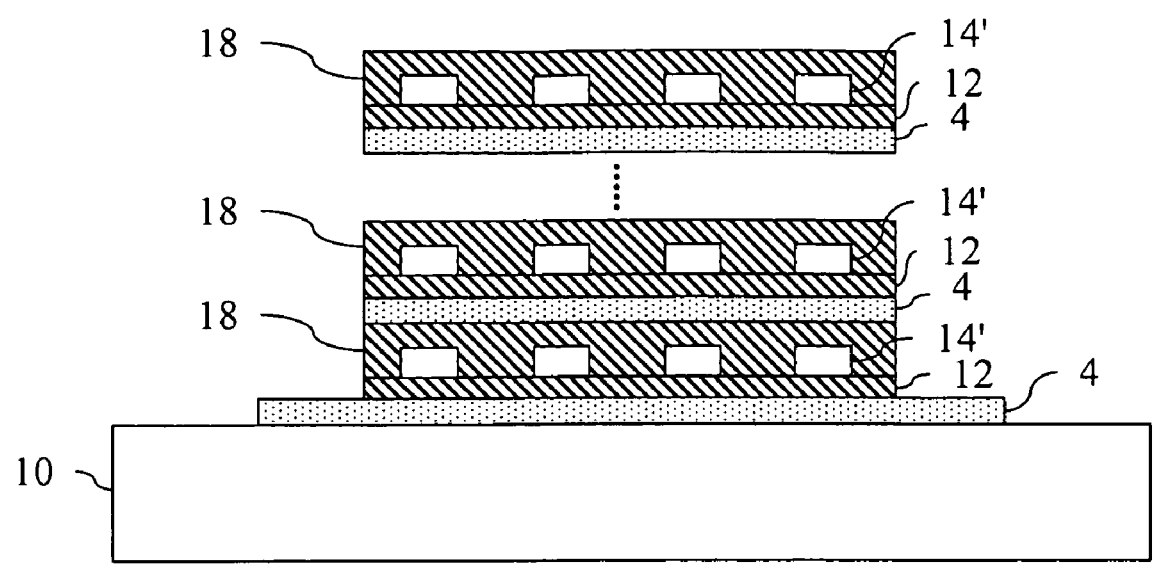

The present invention will be discussed with reference to the following drawings, in which like reference numerals denote like features, and in which:

FIG. 1A-C illustrates exemplary dry-films useful in the invention;

FIG. 2A-E illustrates a printed circuit board having optical functionality at various stages of formation thereof in accordance with an aspect of the invention; and FIG. 3 illustrates a printed circuit board which includes a plurality of waveguides in a stacked arrangement in accordance with a further aspect of the invention.

The present invention provides methods of forming printed circuit boards having optical functionality. The methods involve applying a dry-film layer to a printed circuit board substrate and forming an optical waveguide over the dry-film layer.

FIG. 1A-C illustrates in cross-section exemplary dry-films 1 useful in the methods of the present invention. Suitable dry-films include, for example, those commonly used in forming solder masks and dielectric layers. Suitable such dry-film materials include, for example, acrylates, urethanes and epoxies. Suitable dry-films are commercially available, for example, from Rohm and Haas Electronic Materials (Marlborough, Mass. USA), Nichigo-Morton (Japan) and Eternal Chemical Company (Taiwan). Suitable commercial materials include, for example, LAMINAR™ E9112 dry-film, available from Rohm and Haas Electronic Materials LLC, those sold under the tradename Alpho by Nichigo-Morton (Japan) and Dynamask™ 5016 photothermally-curable epoxy acrylic dry-film, available from Eternal Chemical Company.

The illustrated dry-film 1 includes a carrier substrate 2, a polymeric layer 4 over the carrier substrate, and an optional protective cover layer 6. The protective cover layer 6 may, for example, be disposed on the frontside of the dry-film over the polymeric layer 6 as shown in FIG. 1A or on the backside of the dry-film as illustrated in FIG. 1B. Use of a backside protective cover layer may be desired, for example, where multiple dry-film sheets are arranged in a stacked arrangement or if the dry-film is stored in roll-form 8 such as shown in FIG. 1C. The protective cover layer 6 provides protection to the polymeric layer 4, and is typically in the form of a removable film/sheet that may be peeled from the remainder of the dry-film. The carrier substrate 2 functions as a mechanical support for the polymeric layer 4 and any other layers of the dry-film. The carrier substrate 2 is typically removed from the remainder of the dry-film in subsequent use.

FIG. 2A-E illustrates an optical waveguide structure on a printed circuit board at various stages of formation thereof. As shown in FIG. 2A, a printed circuit board substrate 10 is provided. The printed circuit board substrate is typically constructed from a resin, for example, an epoxy, polyimide or cyanate ester, reinforced by a fabric cloth, for example, a fiberglass cloth. Fiberglass-reinforced epoxy substrates such as FR-4 substrates are commonly used.

The dry-film 1 described above is affixed to the printed circuit board substrate 10 to form a base for forming thereover an optical waveguide bottom clad layer. The dry-film provides a relatively planar surface in comparison to the circuit board substrate surface for formation of the optical waveguide. A typical roughness for the dry-film surface after application to the printed circuit board substrate is 1.5 µm or less as measured by a stylus profiler, for example, the Dektak™ stylus profilers available from Veeco Instruments, Inc., New York, USA. It is believed that improving planarity of the surface on which the waveguide is formed results in reduced optical loss. Suitable techniques for affixing the dry-film to the substrate include, for example, lamination such as vacuum lamination, hot-roll lamination or cut-sheet lamination. In an exemplary method, the dry-film 1 is placed into a hot-roll laminator, the protective cover layer 6 is peeled away from the polymeric layer 4, and the polymeric layer 4 is brought into contact with and laminated to the printed circuit board substrate 10 using rollers 11 with heat and pressure. While conditions will vary depending on the particular materials, the lamination temperature is typically from about 21 to 150° C., for example, from about 25 to 110° C. The pressure is typically from about 0.1 to 5 kg/cm², for example, from about 0.3 to 2 kg/cm². The speed of the rollers 11 is typically from about 1.5 to 600 cm/min, for example, from about 30 to 150 cm/min. After lamination, the carrier substrate 2 may be removed from the polymeric layer 4 and printed circuit board substrate 10, typically by peeling. The polymeric layer 4 may next be cured by thermal treatment in the case of a thermally curable composition. Typical curing temperatures are from about 120 to 200° C., for example, from about 145 to 180° C., and curing time is typically from about 0.5 to 5 hours, for example, from about 1 to 3 hours. Optionally, the dry-film surface may be treated for purposes of promoting adhesion with the optical waveguide to be formed. Such surface treatment may include, for example, one or more of: mechanical polishing, treatment with corona discharge, flame, ozone, or plasma, and formation of an adhesion-promoting layer.

An optical waveguide structure is next formed on, typically in direct contact with as shown, the dry-film polymeric layer 4. Waveguides may, for example, be formed by a multilayer process including first clad layer formation, core layer formation followed by core patterning, and second clad layer formation. With reference to FIG. 2B, a first cladding layer 12 is formed on the dry-film layer 4. Suitable compositions for this layer and other layers are described below. The first cladding layer (as well as the other waveguide layers to be described) may be formed by known techniques including, but not limited to, screen printing, curtain coating, roller coating, slot coating, spin coating, flood coating, electrostatic spray, spray coating, or dip coating. When spray coat in conducted, a heated spray gun may optionally be used. The viscosity of the composition may be adjusted to meet the requirements for each method of application by viscosity modifiers, thixotropic agents, fillers and the like. The first cladding layer is typically deposited to a thickness in the dried state of from 1 to 200 µm, for example, from 1 to 100 µm or 10 to 50 µm. The first cladding layer 12 may be cured, for example, thermally and/or photolytically depending on the type of active component in the first cladding composition. The thermal curing temperature is typically from 90° C. to 300° C., for example from 90° C. to 220° C. Such curing typically occurs over a period of from five seconds to one hour. Such curing may be affected by heating the substrate in an oven or on a hot plate. Alternatively the waveguide clad can be flood-exposed, for example, with 1 to 2 Joules/cm² of actinic radiation followed by the thermal cure from 90° C. to 300° C., for example from 90° C. to 220° C.

As shown in FIG. 2C, a core layer 14 is next formed on the first clad layer 12. The core layer is typically coated to a thickness of from about 1 to 100 µm, for example, from about 8 to 60 µm. The coated substrate is then soft cured, such as by baking, to remove solvent in the coating. Such curing may take place at various temperatures, depending upon the particular solvent chosen. Suitable temperatures are any that are sufficient to substantially remove any solvent present. The soft curing is typically conducted at a temperature from room temperature (25° C.) to 300° C. depending, for example, on the substrate and thermal budget. Such curing can occur, for example, over a period of from 5 seconds to 60 minutes in an oven or on a hot plate. After curing, the core layer is patterned. In the case of a photoimageable material, the core layer may be imaged by exposure to actinic radiation. Such methods include, for example, contact imaging, projection imaging, and laser direct write imaging, including laser direct write imaging by multiphoton absorption. The exposure pattern, as defined, for example, by mask 16 in FIG. 2C, defines the geometry of the waveguide core, which is typically but not necessarily on the order of centimeters to meters in length, and microns to hundreds of microns in width.

Following exposure, the composition can be post exposure cured, typically at a temperature of from 40° to 170° C. Curing time may vary but is generally from about 30 seconds to about 1 hour. The unexposed areas may be removed, such as by contact with a suitable developer, leaving only the exposed areas remaining on the substrate, thus forming core structures 14' in FIG. 2D.

Following development, the structures may undergo a final cure step. The curing can, for example, include a flood exposure, for example, with 1 to 2 Joules/cm² of actinic radiation. Additionally, or alternatively, the waveguides may be heated at a temperature of from about 130° to 300° C. in air or an inert atmosphere such as nitrogen or argon.

Next, a second cladding layer 18 can be formed as described above over the first cladding layer 12 and core structures 14' as shown in FIG. 2E. The second cladding layer material may be the same or different from the first cladding layer, and is typically of the same material. The second cladding layer can be thermally activated and/or photo activated to provide a waveguide structure as described above with respect to the first clad layer. The second cladding layer is typically deposited to a thickness of from the first cladding layer is typically deposited to a thickness in the dried state of from 1 to 200 µm, for example, from 1 to 100 µm or 10 to 50 µm.

Following formation of the optical waveguide structure on the printed circuit board substrate, the printed circuit board may be further processed. For example, one or more dielectric and/or metal layers may be formed over the waveguide structure, to form a metallization structure for signal routing. Electrically connecting an optoelectronic device such as a photodetector or a laser emitting device, for example, a VCSEL chip, may also be performed at this stage. The printed circuit board is processed to completion using known techniques such as those described in Coombs, Printed Circuit Handbook, 5$^{th}$ ed., McGraw-Hill (2001). It may be desired for certain applications that the optical waveguides be formed in a multilevel arrangement of two or more layers of waveguides, for example, as shown in FIG. 3. As illustrated a plurality of waveguide layers may be stacked over each other. In such a case, a dry-film layer 4 as described above may be provided between as a base layer for and between any one or more layers of the waveguides.

In accordance with an exemplary aspect of the invention, the waveguide material may be a composition that includes silsesquioxane units of the formula $(RSiO_{1.5})$, wherein R is the same or different for the dry-film and wet chemistry compositions. Other materials including other polymer systems may be used. The polymer may be present in the composition in an amount of from 1 to 99.5 wt %, for example from 60 to 98.5 wt %. Exemplary organic groups for R include substituted and unsubstituted alkyl, aryl and heterocyclic groups. The alkyl groups may be straight chain, branched or cyclic having, for example, from 1 to 20 carbon atoms, and typically have from 1 to 20 carbon atoms, such as methyl, ethyl, propyl, isopropyl, t-butyl, t-amyl, octyl, decyl, dodecyl, cetyl, stearyl, cyclohexyl, and 2-ethylhexyl. The alkyl groups may be substituted with heteroatoms in and/or on the alkyl chain, for example, or may be non-aromatic cyclic groups such as cyclopentyl, cyclohexyl, norbonyl, adamantly, piperidinyl, tetrahydrofuranyl and tetrahydrothiophenyl groups. Exemplary aryl groups include those having from 6 to 20 carbon atoms, for example, from 6 to 15 carbon atoms, such as phenyl, tolyl, benzyl, 1-naphthyl, 2-naphthyl and 2-phenanthryl, and may be substituted with heteroatoms, for example hydroxy and/or amino. Heterocyclic groups may be aromatic, for example, thiophene, pyridine, pyrimidine, pyrrole, phosphole, arsole, and furane. Typical for R is a substituted and unsubstituted methyl, ethyl, propyl, cyclopentyl, cyclohexyl, benzyl, phenyl, adamantyl groups, and combinations thereof.

The polymer may take the form of a copolymer or higher order polymer, either random- or block-type. The polymer may include, for example, one or more additional silicon-containing units, with the proportions for each unit ranging from 1 to 85 wt %, for example, from 15 to 80 wt % or from 25 to 60 wt %, or from 25 to 50 wt %, based on the polymer. The additional units may, for example, be represented as silsesquioxanes, cage siloxanes, siloxanes and combinations thereof. For example, the polymer may further include units of the formula ($R^1SiO_{1.5}$), wherein $R^1$ is a substituted or unsubstituted organic group as described above with respect to R. One of R and $R^1$ may, for example, be chosen from substituted or unsubstituted alkyl groups, and the other of R and $R^1$ chosen from substituted or unsubstituted aryl groups. The polymer may be, for example, an alkyl silicon polymer such as a copolymer containing methyl silsesquioxane units and butyl silsesquioxane units; an aryl silicon polymer such as a copolymer containing phenyl silsesquioxane units and trifluoromethylphenyl-silsesquioxane units or an aralkyl silicon copolymer such as a copolymer containing methyl and phenyl silsesquioxane units.

Suitable siloxanes include, for example, units of the formula (($R^2$)$_2$SiO), wherein $R^2$ is a substituted or unsubstituted organic group, such as an alkyl group, for example, methyl, ethyl, propyl, and the like, or an aryl group, for example, phenyl, tolyl, and the like.

As described above, the side chain groups of the polymer may be optionally substituted. "Substituted" means that one or more hydrogen atoms on one or more side chain groups are replaced by another substituent group, for example, deuterium, halogen such as fluorine, bromine, and chlorine, ($C_1$-$C_6$)alkyl, ($C_1$-$C_6$)haloalkyl, ($C_1$-$C_{10}$)alkoxy, ($C_1$-$C_{10}$)alkylcarbonyl, ($C_1$-$C_{10}$)alkoxycarbonyl, ($C_1$-$C_{10}$)alkylcarbonyloxy, alkylamine, alkylsulfur containing materials, and the like. The polymers may contain a wide range of repeating units. Thus, the polymer may vary widely in molecular weight. Typically, the polymers have a weight average molecular weight ($M_w$) of from about 500 to 15,000, more typically from about 1000 to 10,000.

The polymers may include two or more functional end groups that allow a solubility change in the composition after photoactivation. Such end groups may be, for example, hydroxy; alkoxy such as ethoxy, propoxy, isopropoxy; carboxyester, amino, amido, epoxy, imino, carboxyacid, anhydride, olefinic, acrylic, acetal, orthoester, vinyl ether, and combinations thereof. The functional end content may be, for example, from about 0.5 to 35 wt % based on the polymer.

The polymeric layers formed from the compositions may be photoimageable and include a component for altering the solubility of the layers upon photoactivation. The photoactive component alters the solubility of the layers in a dried state in a developer. The photoactive component typically generates an acid or base upon activation. A wide variety of photoactive components may be used in the present invention, including, but not limited to, photoacid generators and photobase generators.

The photoacid generators useful in the present invention may be any compound or compounds which generate acid upon exposure to light. Suitable photoacid generators are known and include, but are not limited to, halogenated triazines, onium salts, sulfonated esters, substituted hydroxyimides, substituted hydroxylimines, azides, naphthoquinones such as diazonaphthoquinones, diazo compounds, and combinations thereof.

Useful halogenated triazines include, for example, halogenated alkyl triazines such as the trihalomethyl-s-triazines. The s-triazine compounds are condensation reaction products of certain methyl-trihalomethyl-s-triazines and certain aldehydes or aldehyde derivatives. Such s-triazine compounds may be prepared according to the procedures disclosed in U.S. Pat. No. 3,954,475 and Wakabayashi et al., Bulletin of the Chemical Society of Japan, 42, 2924-30 (1969). Other triazine type photoacid generators useful in the present invention are disclosed, for example, in U.S. Pat. No. 5,366,846.

Onium salts with weakly nucleophilic anions are particularly suitable for use as photoacid generators in the present invention. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to, diazonium salts such as diaryl-diazonium salts and onium salts of group VA and B, IIA and B and I of the Periodic Table, for example, halonium salts such as iodonium salts, quaternary ammonium, phosphonium and arsonium salts, sulfonium salts such as aromatic sulfonium salts, sulfoxonium salts or selenium salts. Examples of suitable onium salts are disclosed, for example, in U.S. Pat. Nos. 4,442,197; 4,603,101; and 4,624,912. Sulfonium salts such as triphenylsulfonium hexafluorophosphate and mixtures thereof are typical.

The sulfonated esters useful as photoacid generators in the present invention include, for example, sulfonyloxy ketones. Suitable sulfonated esters include, but are not limited to, benzoin tosylate, t-butylphenyl alpha-(p-toluenesulfonyloxy)-acetate, 2,6-dinitrobenzyl tosylate, and t-butyl alpha-(p-toluenesulfonyloxy)-acetate. Such sulfonated esters are disclosed, for example, in the Journal of Photopolymer Science and Technology, vol. 4, No. 3,337-340 (1991).

Substituted hydroxyimides which may be used include, for example, n-trifluoromethylsulfonyloxy-2,3-diphenylmaleimide and 2-trifluoromethylbenzenesulfonyloxy,2,3-diphenylmaleimide. Suitable substituted hydroxylimines include, for example, 2-(-nitrilo-2-methylbenzylidene)-(5-hydroxyiminobutylsulfonyl)-thiophene. Azides useful in the present invention include, for example, 2,6-(4-azidobenzylidene)cyclohexanone. Naphthoquinones may include, for example, 2,1-diazonaphthoquinone-4-sulfonate ester of 2,3,4-trihydroxybenzophenone. Among the diazo compounds, 1,7-bis(4-chlorosulonyl phenyl)-4-diazo-3,5-heptanedione may be used.

Photobase generators useful in the present invention may be any compound or compounds which liberate base upon exposure to light. Suitable photobase generators include, but are not limited to, benzyl carbamates, benzoin carbamates, O-carbamoylhydroxyamines, O-carbamoyloximes, aromatic sulfonamides, alpha-lactams, N-(2-allylethenyl)amides, arylazide compounds, N-arylformamides, 4-(ortho-nitrophenyl) dihydropyridines, and combinations thereof.

The amount of photoactive component, in the case of a negative working material, is any amount sufficient to alter the solubility of the polymeric layer upon exposure to actinic radiation and render the exposed portion insoluble in a developer. The photoactive component is typically present in the composition in an amount of from 0.01 to 25 wt %, for example from 0.1 to 25 wt % or from 0.1 to 12 wt %.

The developer for the photoimageable waveguide core and/or clad may be an aqueous or non-aqueous developer solution, or a combination thereof, and may optionally include one or more additives, for example, antifoaming agents, surfactants and the like. Typical aqueous developers include, for example, alkali metal hydroxides such as sodium hydroxide and potassium hydroxide in water, as well as tetraalkylammonium hydroxide such as tetramethylammonium hydroxide, in water. Such developers are typically used in concentrations from 0.1 to 2N, for example, 0.15 to 1N, or 0.26 to 0.7N.

Typical non-aqueous developers include, for example, ketones, for example acetone, methyl ethyl ketone, methyl isobutyl ketone, cyclohexanone, 2-octanone, 2-heptanone and methyl isoamyl ketone; alcohols such as ethanol, isopropanol, n-propanol, n-butanol, isobutanol and benzyl alcohol; esters such as ethyl acetate, ethyl propionate and ethyl lactate; glycol ethers such as ethylene glycol methyl ether, propylene glycol ethyl ether, propylene glycol methyl ether; glycol ether esters such as ethylene glycol monomethyl ether acetate and propylene glycol mono methyl ether acetate; aromatics such as toluene, xylene, chlorobenzene, dichlorobenzene and the like, and combinations thereof.

Development is typically conducted at a temperature of from 20 to 85° C., for example from 21 to 49° C. Development time with aggressive agitation may be within ten minutes, for example, within five minutes, within two minutes, within one minute, or within 30 seconds. Development may take place, for example, in a static development chamber or in a spray chamber. Typical spray pressures range from 5 to 40 psig, for example, from 10 to 25 psig.

One or more components for improving the flexibility of the structures formed from the composition may be present in the composition. These flexibility-improving materials typically contain a plurality of functional groups chosen from hydroxy, amino, thiol, sulphonate ester, carboxylate ester, silyl ester, anhydride, aziridine, methylolmethyl, silyl ether, epoxides, oxetanes, vinyl ethers, silanols and combinations thereof. In the flexibility-improving materials, the functional groups are typically attached to backbone materials. Exemplary backbone materials include substituted and unsubstituted alkyl and aryl hydrocarbons, ethers, acrylates, novolacs, polyimides, polyurethanes, polyesters, polysulfones, polyketones, fullerenes, POSS silicons, nanoparticles, and combinations thereof. The functional groups may be present as end groups on the backbone and/or at one or more locations along the backbone.

Examples of flexibilizing components are polyols of formula $R^3(OH)_x$ wherein $R^3$ is an organic group chosen from substituted or unsubstituted $(C_2-C_{25})$ alkyl, $(C_7-C_{25})$ aryl, $(C_8-C_{25})$ aralkyl, $(C_6-C_{25})$ cycloalkyl, and combinations thereof, wherein x is 2 or more and does not exceed the number of carbon atoms. When x is 2, examples of the flexibilizing component include glycols, which are 1,2 diols, such as $HOCH_2$—CHOH—$(CH_2)_y$—$CH_3$ wherein y may be, for example, from 0 to 22, such as propylene glycol and butylene glycol. Other examples include $\alpha,\omega$-diols such as HO—$(CH_2)_z$—OH wherein z is, for example, from 2 to 25 such as ethylene glycol, 1,3-propanediol and 1,4-butanediol. When x is 3 examples include glycerin and trimethylolpropane.

$R^3$ may also be a polyether of formula —O—$(CR^4_2)_w$— wherein w is, for example, from 1 to 13 and $R^4$ is the same or different and may be, for example, H, or a substituted or unsubstituted organic group of formula $C_1-C_{12}$ alkyl, aryl, aralkyl or cycloalkyl. Examples of flexibilizing components include polyether diols of polyethylene oxide, polypropylene oxide, polybutylene oxide, and polytetrahydrofurane.

The flexibility-improving component may have a weight average molecular weight, for example, of from 62 to 5000, for example from 62 to 2000. This component is present in an effective amount to improve the flexibility of the composition in a dried state before and after activation. The specific amount will depend, for example on the backbone and type of and number of functional groups of the flexibility-improving component. This component may, for example, be present in the composition in an amount of from 0.5 to 35 wt %, for example from 2 to 20 wt %.

In addition to the foregoing flexibilizers, the use of siloxanes such as those described above with reference to the polymer having units of the formula $((R^2)_2SiO)$ may be used.

Other additives may optionally be present in the compositions including, but are not limited to, surface leveling agents, wetting agents, antifoam agents, adhesion promoters, thixotropic agents, fillers, viscosity modifiers, and the like. Such additives are well known in the art of coating compositions. The use of surface leveling agents, for example silicone-base oils such as SILWET L-7604 silicone-base oil available from Dow Chemical Company, in the compositions may be used. It will be appreciated that more than one additive may be combined in the compositions of the present invention. For example, a wetting agent may be combined with a thixotropic agent. The amounts of such optional additives to be used in the present compositions will depend on the particular additive and desired effect, and are within the ability of those skilled in the art. Such other additives are typically present in the composition in an amount of less than 5 wt %, for example less than 2.5 wt %.

The compositions useful in the invention may optionally contain one or more organic cross-linking agents. Cross-linking agents include, for example, materials which link up components of the composition in a three-dimensional manner. Aromatic or aliphatic cross-linking agents that react with the silicon-containing polymer are suitable for use in the present invention. Such organic cross-linking agents will cure to form a polymerized network with the silicon-containing polymer, and reduce solubility in a developer solution. Such organic cross-linking agents may be monomers or polymers. It will be appreciated by those skilled in the art that combinations of cross-linking agents may be used successfully in the present invention.

Suitable organic cross-linking agents useful in the present invention include, but are not limited to, amine containing compounds, epoxy containing materials, compounds containing at least two vinyl ether groups, allyl substituted aromatic compounds, and combinations thereof. Typical cross-linking agents include amine containing compounds and epoxy containing materials.

The amine containing compounds useful as cross-linking agents in the present invention include, but are not limited to, melamine monomers, melamine polymers, alkylolmethyl melamines, benzoguanamine resins, benzoguanamine-formaldehyde resins, urea-formaldehyde resins, glycoluril-formaldehyde resins, and combinations thereof.

It will be appreciated by those skilled in the art that suitable organic cross-linker concentrations will vary with factors such as cross-linker reactivity and specific application of the composition. When used, the cross-linking agent(s) is typically present in the composition in an amount of from 0.1 to 50 wt %, for example, from 0.5 to 25 wt % or from 1 to 20 wt %.

One or more of the additives may serve to adjust refractive indices of the polymeric layers, for example, in the case of an optical waveguide, the core and/or clad layers.

The compositions typically further include a solvent. A wide variety of solvents may be used, for example: glycol ethers, such as ethylene glycol monomethyl ether, propylene glycol monomethyl ether, and dipropylene glycol monomethyl ether; esters such as methyl cellosolve acetate, ethyl cellosolve acetate, propylene glycol monomethyl ether acetate, dipropylene glycol monomethyl ether acetate; dibasic esters; carbonates such as propylene carbonate; γ-butyrolactone; esters such as ethyl lactate, n-amyl acetate and n-butyl acetate; alcohols such as n-propanol, iso-propanol; ketones such as cyclohexanone, methyl isobutyl ketone, diisobutyl ketone and 2-heptanone; lactones such as γ-butyrolactone and γ-caprolactone; ethers such as diphenyl ether and anisole; hydrocarbons such as mesitylene, toluene and xylene; and heterocyclic compounds such as N-methyl-2-pyrrolidone, N,N'-dimethylpropyleneurea; and mixtures thereof.

The following examples are intended to illustrate further various aspects of the present invention, but are not intended to limit the scope of the invention in any aspect.

EXAMPLE

Four FR4 circuit board substrates with 7628/1080 fiberglass weave were provided. The surface roughness of each of the substrates was measured with a Veeco Instruments Dektak™ V 200-Si stylus profiler. The results of these measurements are shown below in Table 1. The substrates were cleaned with acetone and dried with compressed air. A 40 micron thick Dynamask™ 5016 photothermally-curable epoxy acrylic dry-film (Eternal Chemical Company, Taiwan) was hot-roll laminated on each substrate at 230° F. (110° C.), 4 feet/minute (122 cm/minute) and 40 psi (275.8 kilopascals) with a Morton Thiokol Model 300 hot-roll laminator. The dry-film layers were exposed with UV radiation at 500 mJ/cm$^2$ on an Olec Accuprint AP-30-800 Super Eight exposure unit. The PET coversheet of each dry-film layer was removed, and the dry-film layers were exposed for an additional 3000 mJ/cm$^2$. The coated circuit boards were place horizontally in a 150° C. forced air oven for 1 hour. The surface roughness of each of the coated dry-films was measured with the stylus profiler, the results of which are shown in Table 1.

TABLE 1

| Sample | Substrate Surface Roughness (μm) | Coated Dry-Film Surface Roughness (μm) |
|---|---|---|
| 1 | 2.0-4.0 | 0.4-1.0 |
| 2 | 2.0-3.0 | 0.3-1.4 |
| 3 | 1.0-3.0 | 0.3-1.0 |
| 4 | 2.0-3.0 | 0.3-1.0 |

As can be seen from Table 1, the dry-film coated circuit substrate provides a significantly smoother surface in comparison with that of the circuit board substrate.

An optical waveguide was next formed on the dry-film layer of each circuit board. A bottom clad layer composition was coated directly on each dry-film layer. The composition of the bottom clad layer included 59.0 wt % silsesquioxane polymer, 35.0 wt % propylene glycol monomethyl ether acetate and 6.0 wt % additives including plasticizer, photoacid generator, stabilizer and wetting/flow control agents. The bottom clad layer was soft-baked for 15 minutes at 90° C., exposed with UV radiation at 300 mJ/cm$^2$ with a Tamarack 161C exposure unit, and post-exposure baked for 10 minutes at 90° C. A final cure/hard bake was conducted for 60 minutes at 145° C. The dried thickness of the bottom clad layer was about 48 microns.

A core layer composition was next coated on the bottom clad layer of each circuit board. The composition of the core layer included 58.4 wt % silsesquioxane polymer, 39.9 wt % propylene glycol monomethyl ether acetate and 1.7 wt % additives including photoacid generator, stabilizer and wetting/flow control agents. The core layer was soft-baked for 30 minutes at 90° C., exposed through artwork defining a core pattern (50 micron width by 1 meter length) with UV radiation at 250 mJ/cm$^2$ and post-exposure baked for 10 minutes at 90° C. The exposed core layer was developed using an aqueous alkaline developer solution to form the waveguide core structure. A final cure/hard bake was conducted for 60 minutes at 145° C. The thickness of the core was about 43 microns.

A top clad layer was formed over the core and bottom clad layer for each of the circuit boards using the same composition and procedure described for the bottom clad layer. The dried thickness of the top clad layer was about 75 microns. Optical loss of the waveguides was measured using a Laser-Max LAS 830-100 SW diode laser and Gigahertz Optik P-9710 power meter with Si diode detector. Optical loss was calculated according to the following equation, with the results being shown in Table 2, below:

Optical Loss (db/cm)=−10 log(power output/power input)/waveguide length.

Comparative Example

Four FR4 circuit board substrates with 7628/1080 fiberglass weave were cleaned with acetone and dried with compressed air. An optical waveguide was formed directly on each circuit board and optical loss measured using the materials and procedures described in the Example above. The optical loss measurement results are shown in Table 2.

TABLE 2

| Optical Loss - Waveguide on Substrate (db/cm) | Optical Loss - Waveguide on Dry-Film (db/cm) |
|---|---|
| 0.098 | 0.04 |
| 0.106 | 0.056 |
| 0.162 | 0.048 |
| 0.174 | 0.062 |
| Avg. 0.135 | 0.052 |

As can be seen in Table 2, the optical losses for the waveguides formed directly on the dry-film layers were significantly lower than those for the waveguides formed on the circuit board substrates.

What is claimed is:

1. A method of forming a printed circuit board having optical functionality, comprising:
    applying a dry-film layer to a printed circuit board substrate; and
    forming an optical waveguide directly on the dry-film layer, the forming comprising:
        forming a first clad layer directly on the dry-film layer, wherein the first clad layer forms a lowermost portion of the waveguide;
        forming a core layer on the first clad layer;
        patterning the core layer to form a core; and
        forming a second clad layer on the first clad layer and the core.

2. The method of claim 1, wherein the dry-film layer is of a type which is useful as solder-mask or dielectric dry-film layer.

3. The method of claim 1, wherein the waveguide core and/or clad comprises units of the formula $(RSiO_{1.5})$, wherein R is a substituted or unsubstituted organic group.

4. The method of claim 1, further comprising forming a second optical waveguide on the optical waveguide in a stacked arrangement.

5. The method of claim 4, further comprising applying a second dry-film layer on the waveguide and forming the second optical waveguide directly on the second dry-film layer.

6. The method of claim 1, further comprising before formation of the clad, treating the surface of the dry-film layer to improve adhesion to the waveguide.

7. The method of claim 6, wherein the treating comprises one or more of mechanical polishing or treatment with corona discharge, flame, ozone or plasma.

8. The method of claim 1, further comprising forming electrical circuitry on the printed circuit board substrate.

9. A printed circuit board formed by the method of claim 1.

10. The method of claim 1, wherein the dry-film layer is formed of a material chosen from acrylates, urethanes and epoxies.

11. The method of claim 3, wherein the dry-film layer is formed of a material chosen from acrylates, urethanes and epoxies.

12. The method of claim 11, wherein the waveguide core and clad comprise units of the formula $(RSiO_{1.5})$, wherein R is a substituted or unsubstituted organic group.

* * * * *